(12) United States Patent
Emoto et al.

(10) Patent No.: US 6,795,202 B2
(45) Date of Patent: Sep. 21, 2004

(54) WAFER PROCESSING APPARATUS HAVING WAFER MAPPING FUNCTION

(75) Inventors: Jun Emoto, Tokyo (JP); Takeshi Kagaya, Tokyo (JP); Kazuo Yamazaki, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 10/712,040

(22) Filed: Nov. 14, 2003

(65) Prior Publication Data

US 2004/0144933 A1 Jul. 29, 2004

(30) Foreign Application Priority Data

Nov. 15, 2002 (JP) ........................................ 2002-331868

(51) Int. Cl.[7] .............................................. G01B 11/28
(52) U.S. Cl. ................ 356/630; 250/559.4; 250/559.33; 414/217; 414/749.5
(58) Field of Search ................................. 356/629–630, 356/638–640, 394–395, 398; 250/559.36, 559.33, 559.4, 548; 414/217, 416, 744.3, 749.5

(56) References Cited

U.S. PATENT DOCUMENTS

| | | | |
|---|---|---|---|
| 5,102,291 A | * | 4/1992 | Hine ........................... 414/816 |
| 5,950,643 A | * | 9/1999 | Miyazaki et al. ........... 134/25.4 |
| 6,013,920 A | | 1/2000 | Gordon et al. |
| 6,082,949 A | | 7/2000 | Rosenquist |
| 6,138,721 A | | 10/2000 | Bonora et al. |
| 6,188,323 B1 | | 2/2001 | Rosenquist et al. |
| 6,220,808 B1 | | 4/2001 | Bonora et al. |
| 6,281,516 B1 | | 8/2001 | Bacchi et al. |
| 6,298,280 B1 | | 10/2001 | Bonora et al. |
| 6,364,745 B1 | | 4/2002 | Gonzalez-Martin et al. |
| 6,396,072 B1 | | 5/2002 | Meyhofer et al. |
| 6,520,733 B1 | * | 2/2003 | Taniyama et al. ......... 414/749.5 |
| 6,558,750 B2 | * | 5/2003 | Gramarossa et al. ...... 427/430.1 |
| 6,593,152 B2 | * | 7/2003 | Nakasuji et al. ............... 438/14 |
| 6,610,993 B2 | * | 8/2003 | Meyhofer et al. ........ 250/559.4 |

FOREIGN PATENT DOCUMENTS

| | | |
|---|---|---|
| JP | 8-213447 | 8/1996 |
| JP | 9-237810 | 9/1997 |
| JP | 10-308438 | 11/1998 |
| JP | 11-3927 | 1/1999 |
| JP | 11-31738 | 2/1999 |

(List continued on next page.)

*Primary Examiner*—Frank G. Font
*Assistant Examiner*—Sang H. Nguyen
(74) *Attorney, Agent, or Firm*—Oblon, Spivak, McClelland, Maier & Neustadt, P.C.

(57) ABSTRACT

If a plurality of wafers are placed on each shelf of a rack in a pod, some problems will arise in processing processes. In addition, in some apparatus for detecting wafers, driving means having a not so high stability in the speed such as an air-operated cylinder is used for moving the sensor, in order to make the structure simple. In the case that detection is performed while the sensor is moved by such driving means, errors becomes large and it is difficult to detect wafers accurately. The present invention provides a wafer processing apparatus provided with a transmissive wafer detection sensor, a dog having index means and a transmissive sensor for the dog. The wafer processing apparatus calculates the ratio of the duration time of a signal from the transmissive wafer detection sensor and the duration time of a signal from the transmissive sensor for the dog corresponding to the index means and compares the ratio with a threshold value set in advance to determine the number of wafers.

20 Claims, 11 Drawing Sheets

FOREIGN PATENT DOCUMENTS

| | | |
|---|---|---|
| JP | 11-214483 | 8/1999 |
| JP | 11-233595 | 8/1999 |
| JP | 2000-133697 | 5/2000 |
| JP | 2000-223554 | 8/2000 |
| JP | 2001-516152 | 9/2001 |
| JP | 2001-284439 | 10/2001 |
| JP | 2002-9133 | 1/2002 |
| JP | 2002-164411 | 6/2002 |
| JP | 2002-246358 | 8/2002 |
| WO | WO 99/13498 | 3/1999 |

* cited by examiner

WAFER PROCESSING APPARATUS HAVING WAFER MAPPING FUNCTION

BACKGROUND OF THE INVENTION

1. Field of the Invention

The present invention relates to a wafer mapping apparatus for detecting presence/absence of wafers on shelves provided in the interior of a clean box for storing semiconductor wafers or the like in a manufacturing process for a semiconductor device, electronic parts and related goods, and optical disks etc.

2. Related Background Art

Recently, in the wafer processing process in the manufacturing process of semiconductor devices or the like that requires a high degree of cleanness, there has been adopted a method in which a highly clean environment is not established in the whole of the room related to the processing. In that method, a mini-environment space that is kept in a highly clean condition is provided in each of wafer processing apparatuses used in the wafer manufacturing process. This method is intended to keep only small spaces, that is, the spaces within wafer processing apparatuses and wafer storing containers (which will be referred to as a pod, hereinafter) for storing wafers during transferring of wafer between the wafer processing apparatuses, instead of keeping a large space such as the room related to the processing. With this method, it is possible to save initial investment and maintenance costs that would be required in the case that the whole room related to the processing of wafers is kept in a highly clean condition, while realizing the effects same as those attained by establishing a highly clean environment within the whole of the room related to the wafer processing to realize an effective manufacturing process.

In the interior of the pod, there is provided a rack having shelves on which wafers are to be placed. Wafers are stored in the rack in such a way that one wafer is allotted to one of the shelves. The wafers received in the rack are transferred between the wafer processing apparatuses with the transferred pod. However, in the course of the processing process performed by the wafer processing apparatuses, wafers that are out of predetermined standards are sometimes generated. Such wafers are removed from the shelve in the pod. Therefore, even if the all of the shelves of the rack are filled with wafers at the initial stage of the manufacturing process, the number of the shelves on which no wafer is placed will increase due to the removals of wafers as the processing process by the wafer processing apparatuses advances.

Since the wafer processing apparatuses performs processing on wafers automatically, each wafer processing apparatus is generally provided with a wafer transferring robot (which will be simply referred to as a transfer robot hereinafter). The transfer robot accesses a shelf of the pod to transfer or bring a wafer for the wafer processing process. If the transfer robot accesses a shelf in which a wafer is not present for the purpose of transferring a wafer in spite that the wafer to be processed is not present in that shelf, there occurs a useless movement process, namely, the robot uselessly accesses the shelf and returns to the original position. As the number of times of useless movement process increases, the overall wafer processing amount decreases. In view of this, it is necessary to detect the presence/absence of the wafer in each shelf of the rack in the pod in each of the wafer processing apparatuses to determine in which shelves wafers in the rack of the pod wafers are stored and in which shelves wafers are not stored (which determination may be called wafer mapping).

For example, in Japanese Patent Application No. 2001-158458 a semiconductor wafer processing apparatus having a wafer mapping function is proposed. The apparatus disclosed in Japanese Patent Application No. 2001-158458 performs wafer mapping using a transmissive sensor for wafer detection including a paired emitter and detector and a dog having regularly formed notches or indentations and a transmissive sensor for the dog arranged in a manner embracing the portion of the dog in which notches are formed. This Japanese Patent Application teaches arranging the emitter and the detector of the transmissive wafer detection sensor opposed to each other with a certain distance therebetween and moving the emitter and the detector in the direction perpendicular to the shelves on which wafers are placed to detect presence/absence of the wafers.

Specifically, when a wafer blocks light from the emitter and the detector does not detect light from the emitter, a non-transmission signal is generated, so that it is determined that a wafer is present on the shelf. On the other hand, when a wafer is not present on the shelf and the detector receives light from the emitter, a transmission signal is generated, so that it is determined that a wafer is present on the shelf. The above-mentioned structure is arranged in such a way that the timing of a signal generated upon detection of each notch as the transmissive sensor for the dog moves along the notches of the dog is just synchronized with the timing at which the emitter and the detector of the transmissive wafer detection sensor pass by each shelf on which a wafer is to be placed. Thus, the detector of the transmissive wafer detection sensor can detect presence/absence of the wafer without fail at the time when a wafer should present between the emitter and detector.

So far, any relevant document that constitutes a prior art has not been discovered.

(1) However, the above-described technology is a mapping technology for detecting only presence/absence of a wafer. Therefore, wafer mapping can be performed with that technology in the case that wafers are placed on the shelves of the rack in the pod on a one-by-one basis (i.e. one wafer on one shelf), but in the case that multiple wafers are placed on a shelf of the rack in the pod, it is not possible to detect the number of the wafers correctly. However, if a plurality of wafers are placed on a shelf (or shelves) of the rack of the pod, a trouble will arise in subsequent processing processes. Therefore, it is required that such a shelf (or shelves) can also be detected in the wafer mapping process performed in the wafer processing apparatus.

(2) Furthermore, in some wafer detection apparatus, driving means having a not so high stability in the speed such as an air-operated cylinder is used for moving the sensor, in order to make the structure simple. Especially, in the case of the air-operated cylinder, the variation in the speed with time is large in the early stage (or period) just after the operation of the cylinder is started or the stage (or period) in which the operation of the cylinder is stopped. In addition, even in the substantially constant speed period other than the above-mentioned periods, the variation in the speed is relatively large. Therefore, there is a problem that errors become large to spoil the accurate wafer detection when the sensor is moved by such driving means upon detection.

SUMMARY OF THE INVENTION

According to the present invention that solve the above-described problem, there is provided a wafer processing apparatus adapted to detect a wafer on each shelf of a rack having shelves on which wafers can be placed provided in a pod, comprising:

moving means that can be moved along the shelves of the rack by driving means;

a first transmissive sensor movable along the shelves of the rack by the moving means and including a first emitter and a first detector that are disposed in such a way as to be opposed to each other, the first emitter and the first detector being arranged in such a way that when the first transmissive sensor is moved along the shelves of the rack, in the case that a wafer is present on a shelf of the rack, light emitted from the first emitter toward the first detector is blocked by the wafer, and in the case that a wafer is not present on a shelf, light emitted from the first emitter is allowed to pass to the first detector;

a second transmissive sensor including a second emitter and a second detector opposed to the second emitter, the second transmissive sensor being movable along the shelves of the rack with the moving means;

a dog disposed between the second emitter and the second detector and having index means that can pass or block light emitted from the second emitter toward the second detector when the second transmissive sensor is moved along the shelves of the rack; and a computing means for performing determination of the number of the wafer(s) placed on a shelf of the rack by comparing a wafer thickness obtained by calculating a ratio of duration time of a first signal from the first transmissive sensor corresponding to the wafer(s) and duration time of a second signal from the second sensor corresponding to the index means and a threshold value that has been set in advance in accordance with the wafer thickness and the number of wafers.

With this apparatus, it is possible to perform accurate wafer detection, even in the case that the scanning speed of a transmissive sensor is varied, without a need for complicated system. In addition, the apparatus can detect multiple wafers.

DETAILED DESCRIPTION OF THE PREFERRED EMBODIMENTS (First Embodiment)

In the following, an embodiment of the present invention will be described with reference to the accompanying drawings. A wafer processing apparatus according to the embodiment of the present invention includes a part for performing scanning for wafer detection and a part for determining presence/absence of wafers and the number of wafers based on data obtained by the scanning. First, the part for performing scanning for wafer detection will be described.

Figure 1:
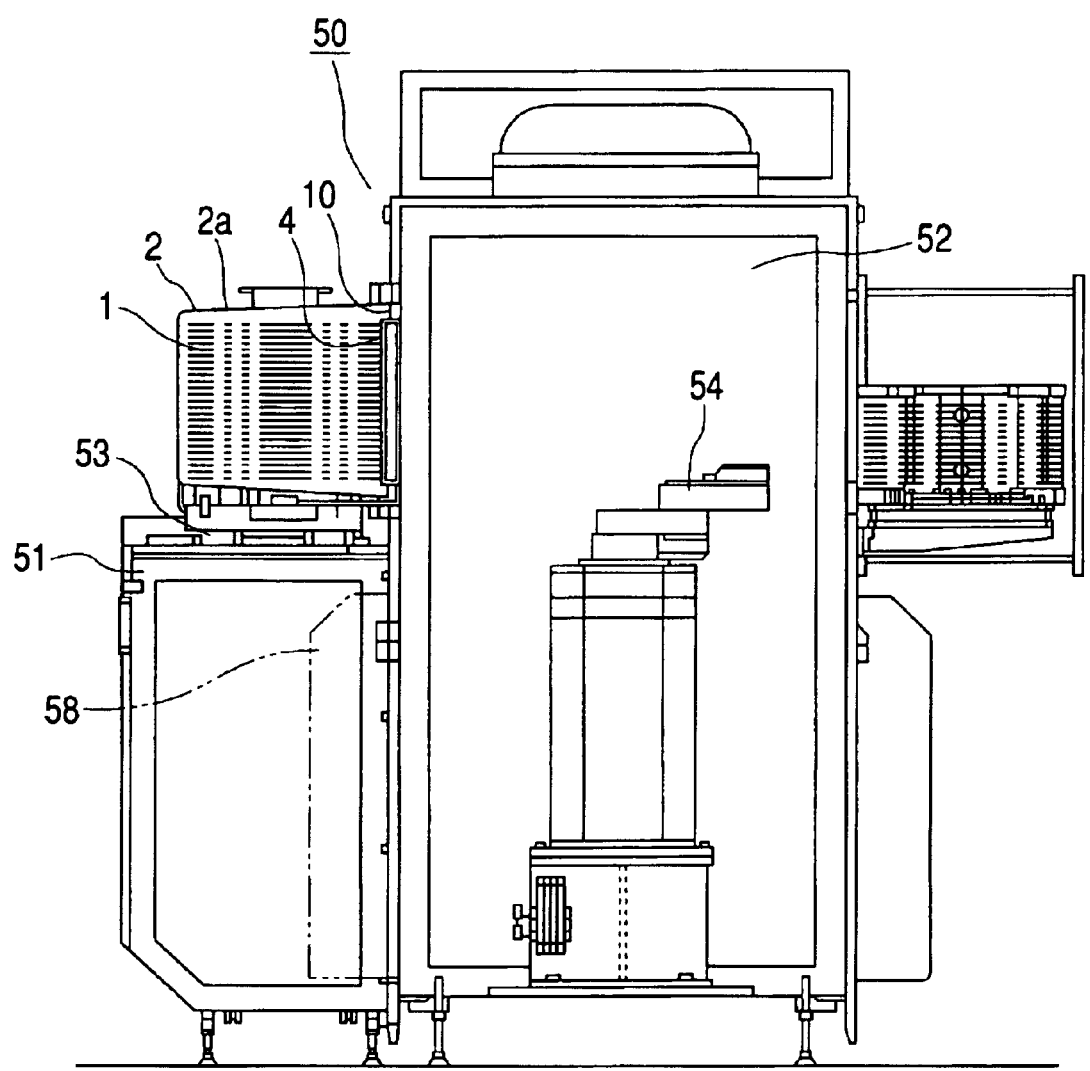
FIG. 1 shows an overall structure of a typical wafer processing apparatus.

FIG. 1 shows the overall structure of a semiconductor wafer processing apparatus 50. The semiconductor wafer processing apparatus 50 is composed mainly of a load port portion 51 and a mini-environment 52. The load port portion 51 and the mini-environment 52 are comparted by a partition and a cover 58. The interior of the mini-environment 52 is kept in a highly clean condition in order to process wafers 1. In addition, a robot arm 54 is provided in the interior of the mini-environment 52 to take out wafers 1 accommodated in a pod 2 after the lid 4 of the pod 2 is opened so as to subject the wafers 1 to a predetermined processing.

A table 53 on which the pod 2 is to be placed is mounted on the top of the load port 51. The table is adapted to move the pod 2 toward and away from the mini-environment 52 on the load port 51. The pod 2 is composed of a body 2a having an interior space that opens at an opening and the lid 4 for closing the opening. In the interior of the body 2a, there is provided a rack having a plurality of shelves arranged in one direction. Wafers 1 are received in the shelves. In principal, each shelf receives one wafer 1, though two stacked wafers are sometimes placed on one shelf. The mini-environment 52 is provided, on its load port 51 side, with a mini-environment opening portion 10 that is a little larger than the lid 4 of the pod 2.

Figure 2A:
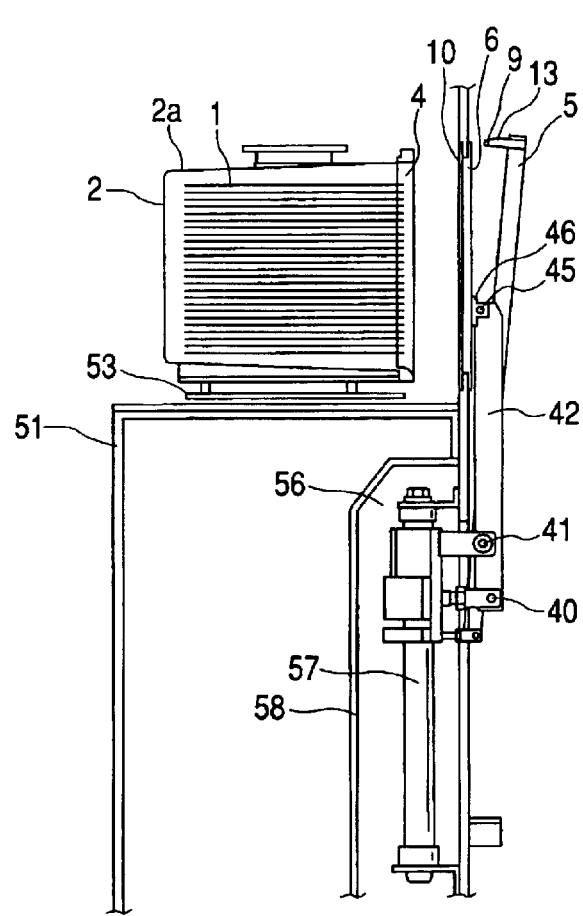
FIG. 2A is an enlarged side view showing a portion including an opener of a wafer processing apparatus.
Figure 2B:
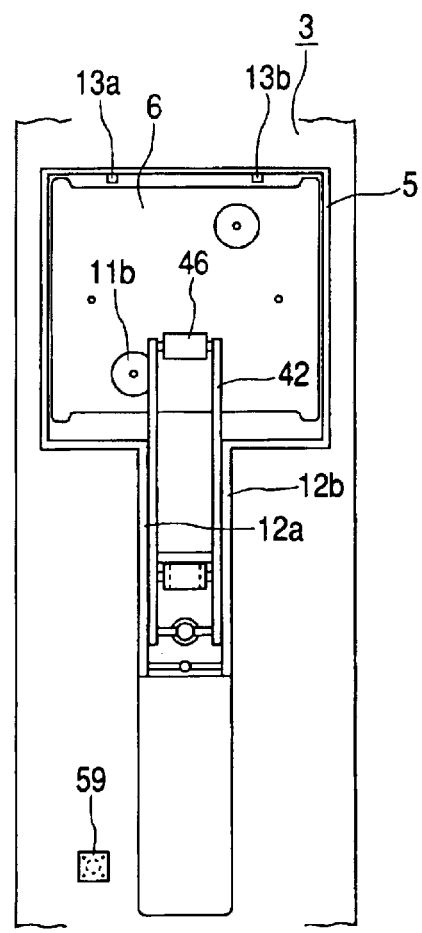
FIG. 2B is an enlarged view showing a portion including the opener of the wafer processing apparatus as seen from inside the mini-environment.

In the vicinity of the mini-environment opening portion 10 and in the interior of the mini-environment 52, there is provided an opener 3 for opening and closing the lid 4 of the pod 2. Here, a description will be made of the opener 3 with reference to FIGS. 2A and 2B. FIG. 2A is an enlarged view showing a portion including the load port portion 51, the pod 2, the opener 3 and the lid 4. FIG. 2B is a view of the portion shown in FIG. 2A as seen from inside the mini-environment 52.

The opener 3 has a door 6 in the form of a plate that is large enough to close the mini-environment opening portion 10 and a mapping frame 5 having a frame structure extending along the outer circumference of the door 6.

The door 6 is supported on one end of a door arm 42 via a fixing member 46. The other end of the door arm 42 is connected to a door opening/closing drive apparatus in the form of an air-operated cylinder not shown for opening and closing the door. The door arm 42 is rotatably supported by a pivot 41 positioned at a certain point between both ends of the door arm 42. Holding portions 11a and 11b in the form of vacuum suction holes are provided on a surface of the door 6. The holding portions 11a and 11b sucks the lid 4 under the state in which the lid 4 is in close contact with the door 6 so as to hold the lid 4 when the door 6 closes the mini-environment opening portion 10. With the above-described structure, the door 6 is swung by the door arm 42 to open and close the mini-environment opening portion 10 while holding the lid 4.

The mapping frame 5 is a member having a frame structure disposed around the door 6 in such a way as to extend along the mini-environment opening portion 10 and to surround the door arm. The mapping frame 5 is attached to a mapping frame arm 12a and a mapping frame arm 12b both of which downwardly extending from the lower portion of the mapping frame 5. The other ends of the mapping frame arm 12a and the mapping frame arm 12b are connected to a cylinder not shown for driving the mapping frame 5. The mapping frame arm 12a and the mapping frame arm 12b are rotatably supported by the pivot 41 at a certain position between both ends of the pair of mapping frame arms 12a and 12b. The mapping frame 5 is swung with the pivot 41 being the center by the drive of the mapping frame driving cylinder not shown. Since the mapping frame 5 is disposed in such a way as to surround the circumference of the door 6, the swinging operation of the door 6 and the swinging operation of the mapping frame 5 can be performed independently from each other without any interference therebetween.

Figure 3A:
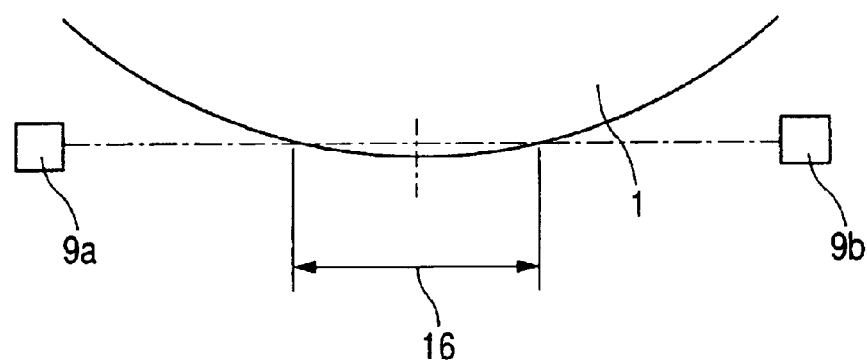
FIG. 3A shows the arrangement of an emitter and a detector of a transmissive wafer detection sensor for detecting a wafer in relation to an wafer, wherein a positional relationship of the transmissive wafer detection sensor and the wafer can be seen from the direction perpendicular to the plane of the wafer.
Figure 3B:
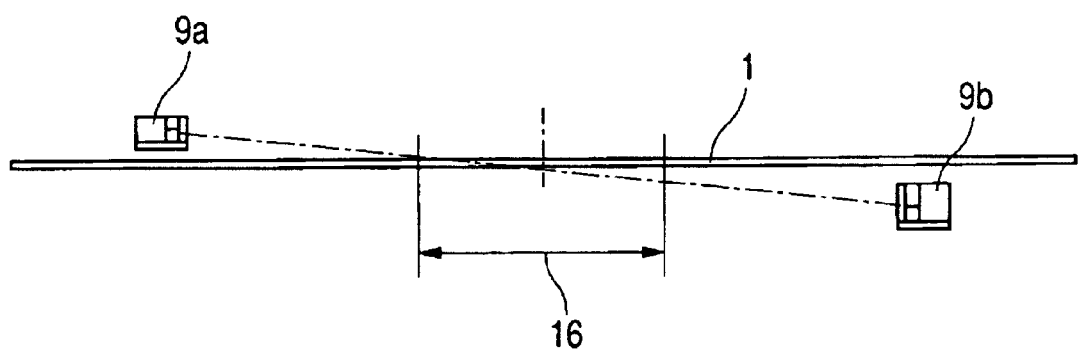
FIG. 3B shows the arrangement of the emitter and the detector of the transmissive wafer detection sensor for detecting a wafer in relation to the wafer, wherein a positional relationship of the transmissive wafer detection sensor and the wafer can be seen from the direction parallel to the plane of the wafer.

On the upper portion of the mapping frame 5, there is provided an elongated sensor support rod 13a and an elongated sensor support rod 13b projecting from the mini-environment toward the pod 2. An emitter 9a serving as a first emitter of a transmissive wafer detection sensor 9 serving as a first transmissive sensor is attached at the tip end of the sensor support rod 13a. On the other hand, a detector 9b serving as a first detector of the transmissive sensor 9 is provided at the tip end of the sensor support rod 13b. The emitter 9a and the detector 9b are disposed in such a way as to be opposed to each other. In addition, the emitter 9a and the detector 9b are disposed with the axis of the light beam emitted from the emitter 9a being adjusted so that the light emitted from the emitter 9a is received by the detector 9b. As shown in FIG. 3A, the emitter 9a and the detector 9b are disposed in such a way that a wafer 1 will be positioned on the axis of the light beam emitted from the emitter 9a between the emitter 9a and the detector 9b. As the emitter 9a and the detector 9b are moved at the same time in the direction orthogonal to the planes of the wafers 1 (i.e. the direction perpendicular to the plane of the drawing sheet of FIG. 3A), when a wafer 1 is present on a shelf of the rack in the pod, the light emitted from the emitter 9a is blocked by a wafer light blocking area 16 at the edge of the wafer 1, so that the light does not reach the detector 9b. On the other hand, when a wafer 1 is not present at a shelf of the rack, the light emitted from the emitter 9a reaches the detector 9b without being blocked by the wafer 1. Thus, with the above-described arrangement of the transmissive wafer detection sensor 9, presence/absence of a wafer can be detected by the transmissive wafer detection sensor 9.

Theoretically speaking, the emitter 9a and the detector 9b may be disposed in such a way that the optical axis (i.e. the central axis of the path of the light beam) from the emitter 9a to the detector 9b is parallel to the plane of the wafer 1. However, in practice it is preferable to dispose the emitter 9a and the detector 9b in such a way that the optical axis from the emitter 9a to the detector 9b is not parallel to the plane of the wafer 1 but inclined at a certain angle. This angle is preferably 0 to 1 degree. Specifically, the emitter 9a and the detector 9b are mounted in an inclined manner with the inclination angle of about 1 degree with respect to the horizontal axis, for example. With such an arrangement, it is possible to prevent the light emitted from the emitter 9a toward the detector 9b from being scattered by defused reflection on the surface of the wafer 1.

Specifically, in practice the light beam emitted from the emitter 9a to the detector 9b diverges at an angle of about 2 degrees, and in the case that the optical axis from the emitter 9a to the detector 9b is arranged horizontally, the light is diffusedly reflected on the surface of the wafer 1. In the case that such diffusion occurs, there is a risk that diffused weak light can enter the detector 9b indirectly in spite of that light should be blocked by the wafer light blocking area 16 so as to be prevented from entering the detector 9b under normal circumstances. In that case, it is erroneously determined that a wafer 1 is not present in spite of that the light from the emitter 9a should be blocked by the wafer light blocking area 16 so that it should be determined that a wafer 1 is present under normal circumstances. Such an erroneous determination can be prevented from occurring by arranging the emitter 9a and the detector 9b in an inclined manner with a certain inclination angle with respect to the horizontal axis.

It will be practical to determine the aforementioned angle of about 1 degree, for example, in the following way. According to a standard set by Semiconductor Equipment Materials International (SEMI), the inclination of wafers 1 in shelves of the rack in the pod 2 must be within the range of ±0.5 mm. In the case of the wafer having a diameter of 300 mm, the above condition is converted to the wafer inclination angle within the range of ±0.1 degree. Therefore, with the aforementioned inclination angle of about 1 degree, the light emitted from the emitter 9a toward the detector 9b is always blocked by the wafer 1 at a certain angle, so that the diffusion can be avoided. In addition, in the case that the sensor arrangement is inclined with the aforementioned angle, the length of time that the path of the light from the emitter 9a to the detector 9b traverses the light blocking area 16 of the wafer is increased as compared to the case that the sensor arrangement is horizontal. Especially, in the present invention, since the duration of a signal generated by the transmissive wafer detection sensor 9 is utilized as will be described later, detection accuracy is advantageously increased when the duration of the signal generated by the transmissive wafer detection sensor 9 can be made as long as possible. Specifically, as the emitter 9a and the detector 9b are moved together in the direction perpendicular to the wafer plane (i.e. in the downward direction in FIG. 3A), in the case that a wafer 1 is present on a shelf of the rack in the pod 2, the light emitted from the emitter 9a sweeps the wafer light blocking area 16 at the edge of the wafer 1 and blocked by the wafer light blocking area 16, so that the light does not reach the detector 9b. On the other hand, in the case that a wafer 1 is not present on a shelf, the light emitted from the emitter 9a reaches the detector 9b without being blocked.

On the other hand, in the case that the inclination angle is too large, variations of the length of time that the light emitted from the emitter 9a is blocked by the wafer light blocking area 16 can become large due to variations of the inclination of the wafers 1 in the shelves of the rack in the pod 2. If the arrangement is set in such a way that the light emitted from the emitter 9a toward the detector 9b passes a position 4 mm away from the edge of the wafer 1, the length of the wafer light blocking area is about 68.5 mm. If it is assumed that a wafer 1 is displaced from an ordinary wafer position toward the front side by 0.5 mm, the length of the wafer light blocking area 16 changes from about 68.5 mm to about 72.5 mm. With this increase in the length of the wafer light blocking area 16, the length of time that the light emitted from the emitter 9a toward the detector 9b is blocked by the wafer blocking area 16 becomes longer than that in the case that the wafer 1 is assumed to be placed at the ordinary position, so that the thickness of the wafer 1 can be determined as longer than the actual thickness. However, even in that case, the thickness of the wafer is determined only about 0.07 mm longer than the actual thickness. Therefore, it does not matter in making correct determination, as long as this variation of the thickness is took into account at the time of the final determination. For example, in the step of determining a threshold value for determining whether the number of wafers is one or two (which will be described later), a margin having a value larger than the aforementioned value will be set. In addition, with the aforementioned inclination angle, actual alignment for determining the position of the emitter 9a and the detector 9b can be realized without any problem. As per the above, the aforementioned inclination angle of about 1 degree is a realistic value for preventing diffusion by the wafer 1 while taking into account variations in the state of the wafers placed in the pod 2.

Incidentally, upon mounting the emitter 9a and the detector 9b in an inclined manner, there is no requirement for whether which of the emitter 9a and the detector 9b is mounted at the upper position.

Figure 4:
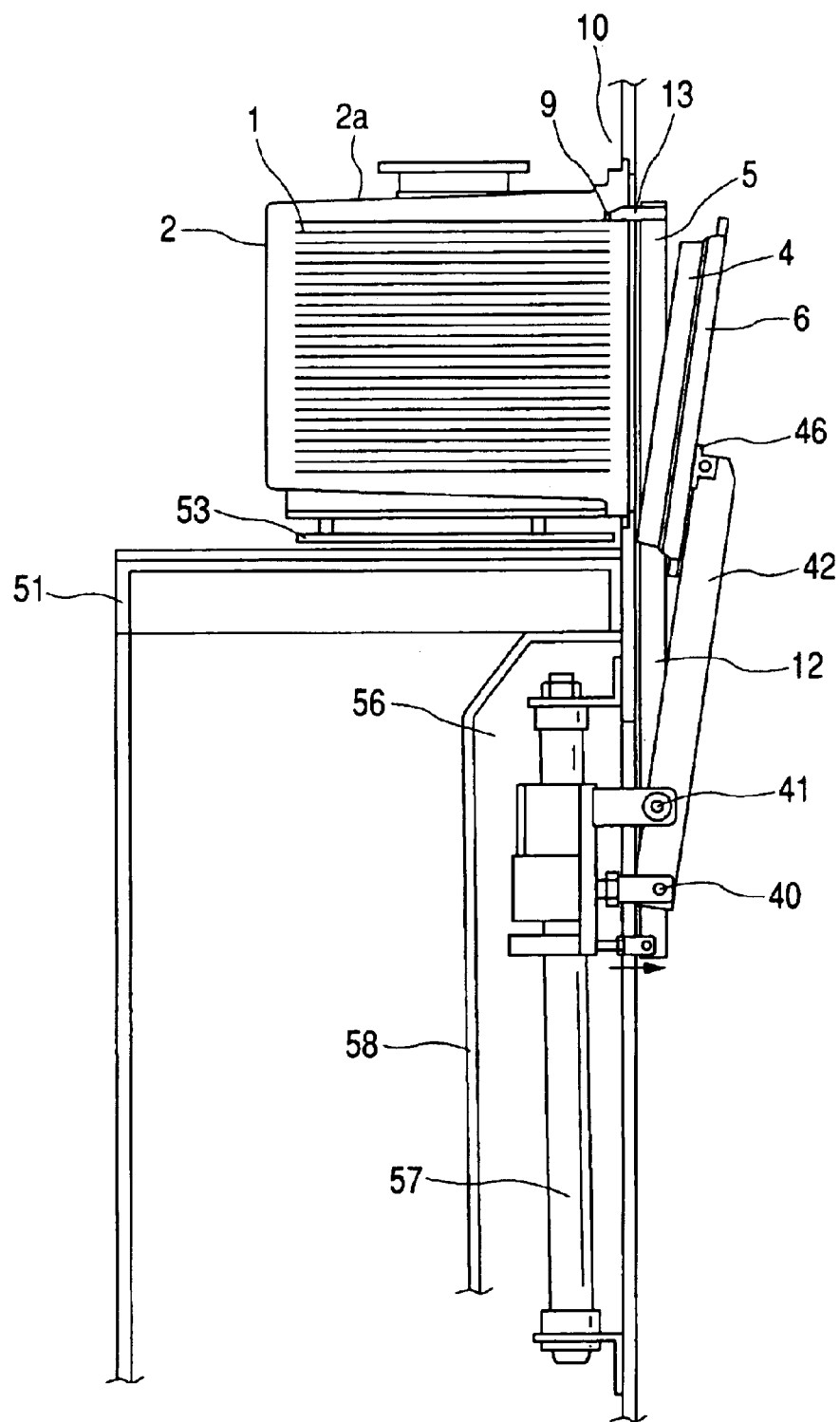
FIG. 4 shows the apparatus under the state before starting mapping of wafers.
Figure 5:
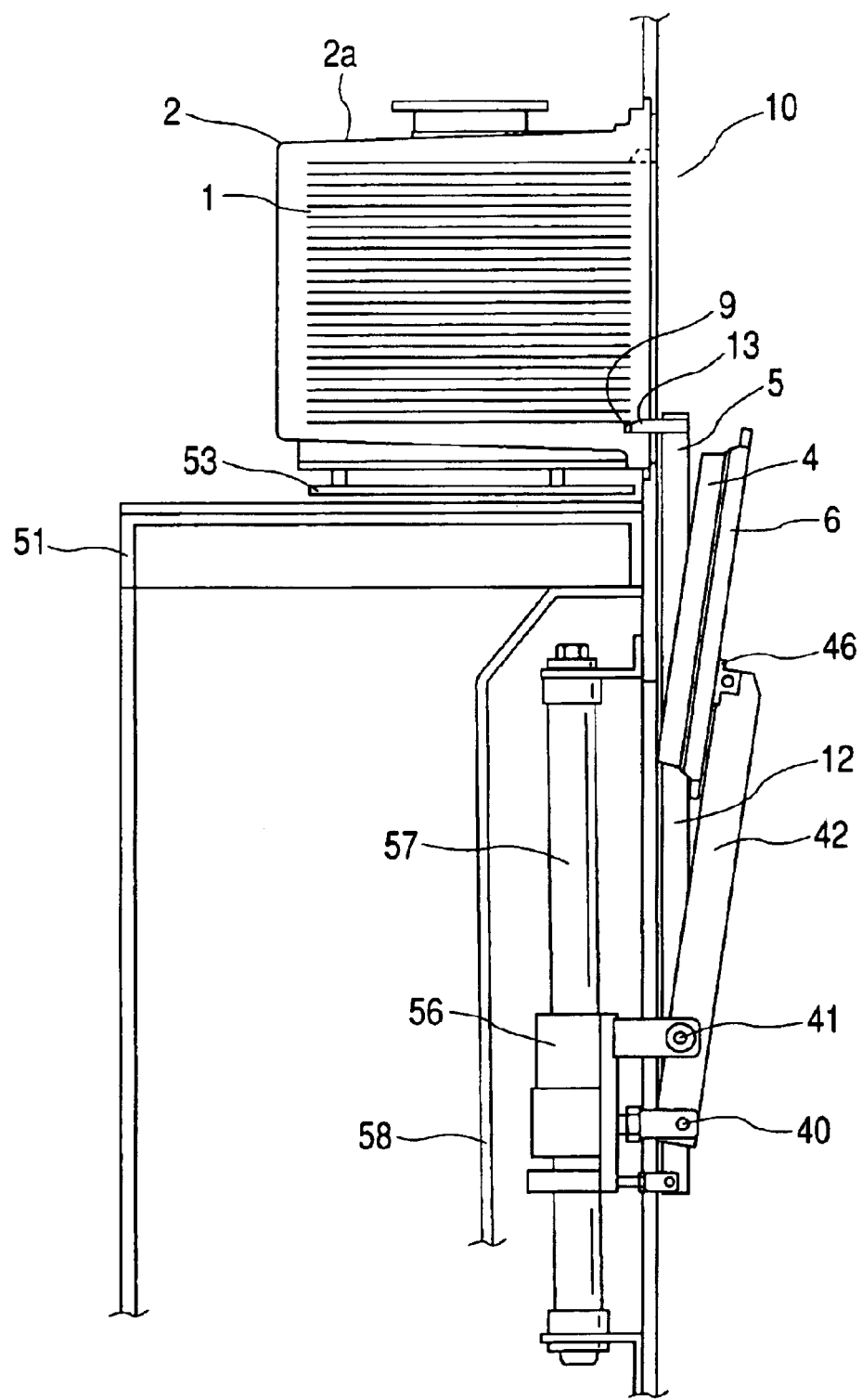
FIG. 5 shows the apparatus under the state after completion of mapping of wafers.

In order to move the transmissive wafer detection sensor 9 in the above-described manner, the semiconductor wafer processing apparatus 50 may be provided with a movable portion 56 serving as moving means for moving the opener 3 including the door 6 and mapping frame 5 up and down. The above-described cylinder 35 for driving the mapping frame 5, the cylinder 31 for opening and closing the door 6 and the pivot 41 are mounted on the movable portion 56. Consequently, the door 6 and the mapping frame 5 provided with the transmissive wafer detection sensor 9 can be moved up and down with the movement of the movable portion 56. The movable portion 56 is movable in the up and down directions while sliding along a rail 57 and the movable portion 56 is moved up and down by contraction and extension of an air-operated rodless cylinder 55. With the above-described structure, the air-operated cylinder 55 is actuated to move the movable portion 56 from the state shown in FIG. 4 in which the emitter 9a and the detector 9b of the transmissive wafer detection sensor 9 are in the stand-by state above the uppermost wafer 1 in the rack in the pod 2 to the state shown in FIG. 5 in which the emitter 9a and the detector 9b are positioned below the lowermost wafer 1 in the rack while the ray between the emitter 9a and the detector 9b traverses the planes of the wafers 1 to scan the wafers 1.

Figure 6:
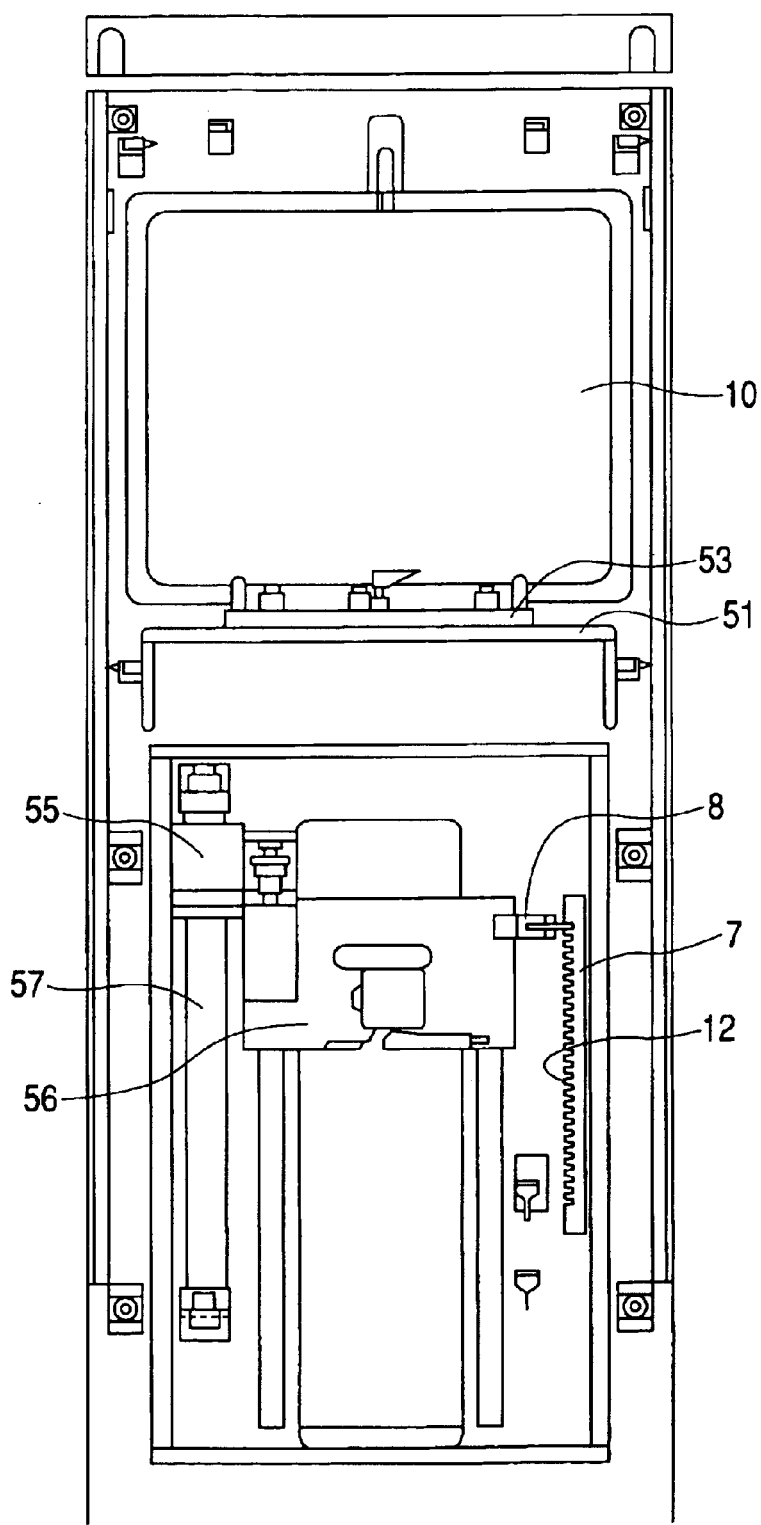
FIG. 6 shows a movable portion of the wafer processing apparatus.

Next in the following, the portion for determining the presence/absence and the number of wafers based on data obtained by the scanning of the wafers will be described. FIG. 6 shows the movable portion 56 of the opener 3 as seen from the load port 51 side.

At the side of the movable portion 56, there is provided a dog 7 extending along the moving direction of the movable portion 56. The dog 7 is an elongated plate member having index means regularly arranged along the longitudinal direction with a constant pitch. In this embodiment, the index means 12 is composed of a plurality of notches (or indentations) having the same width arranged with the same spacing therebetween. The number of the index means 12 is the same as the number of the shelves of the rack in the pod on which the wafers are placed. In addition, it is preferable that each notch of the index means 12 be disposed in such a way as to correspond to the time at which the ray emitted from the emitter 9a of the transmissive wafer detection sensor 9 traverses the wafer light blocking area of each wafer 1.

On the other hand, a transmissive sensor 8 for the dog serving as a second transmissive sensor is fixed to the movable portion 56. The transmissive dog sensor 8 is composed of an emitter 8a serving as a second emitter and a detector 8b serving as a second detector. The emitter 8a and the detector 8b of the transmissive dog sensor 8 are disposed in such a way that the index means 12 of the dog 7 is situated between the emitter 8a and the detector 8b.

Figure 7A:
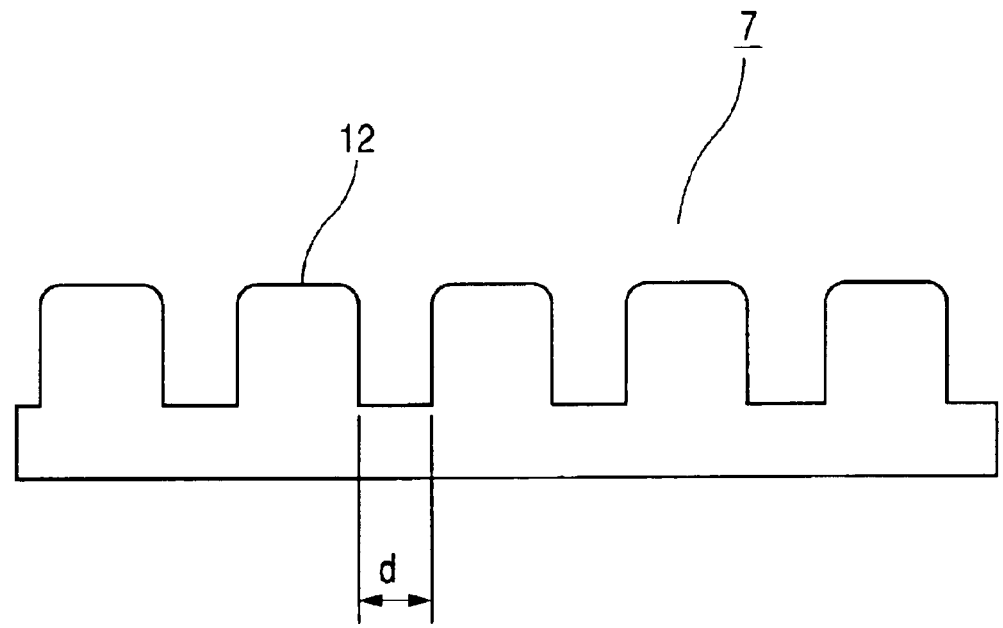
FIG. 7A shows an example of a dog.

The emitter 8a and the detector 8b are mounted in such a way as to be opposed to each other and the optical axis of the emitter 8a is adjusted so that the light emitted from the emitter 8a will be received by the detector 8b. With the arrangement that the index means 12 is situated on the axis of the light beam emitted from the emitter 8a toward the detector 8b, as the emitter 8a and the detector 8b are moved together along the dog 7, in the tab-like portion of the dog 7 at which the index means 12 in the form of a notch is not present, the light emitted from the emitter 8a is blocked by the tab-like portion so as to be prevented from reaching the detector 8b, while in the portion at which the index means 12 in the form of a notch or indentation is present, the light emitted from the emitter 8a passes through the index means 12 to reach the detector 8b. Therefore, so long as the index means12 are designed to have the same known width and arranged with a constant pitch as shown in FIG. 7A, the time duration of a signal generated by the transmissive dog sensor 8 can be used as a reference.

Figure 7B:
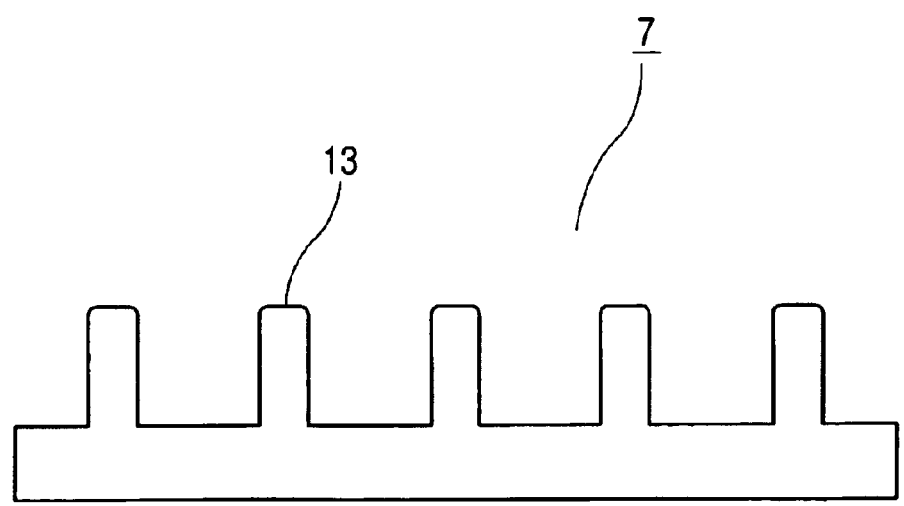
FIG. 7B shows another example of a dog.

While in the description of this embodiment the index means 12 are notches, index means of different forms will also realize the same effect so long as they are designed to have the same known width and arranged with a constant pitch. For example, as shown in FIG. 7B, index means 13 in the form of projections having the same width and arranged with a constant pitch on the dog 7 may be adopted. The form of the index means is not limited to those described above, but they may take various forms having the same known width and arranged with the same (or constant) spacing therebetween.

Figure 8:
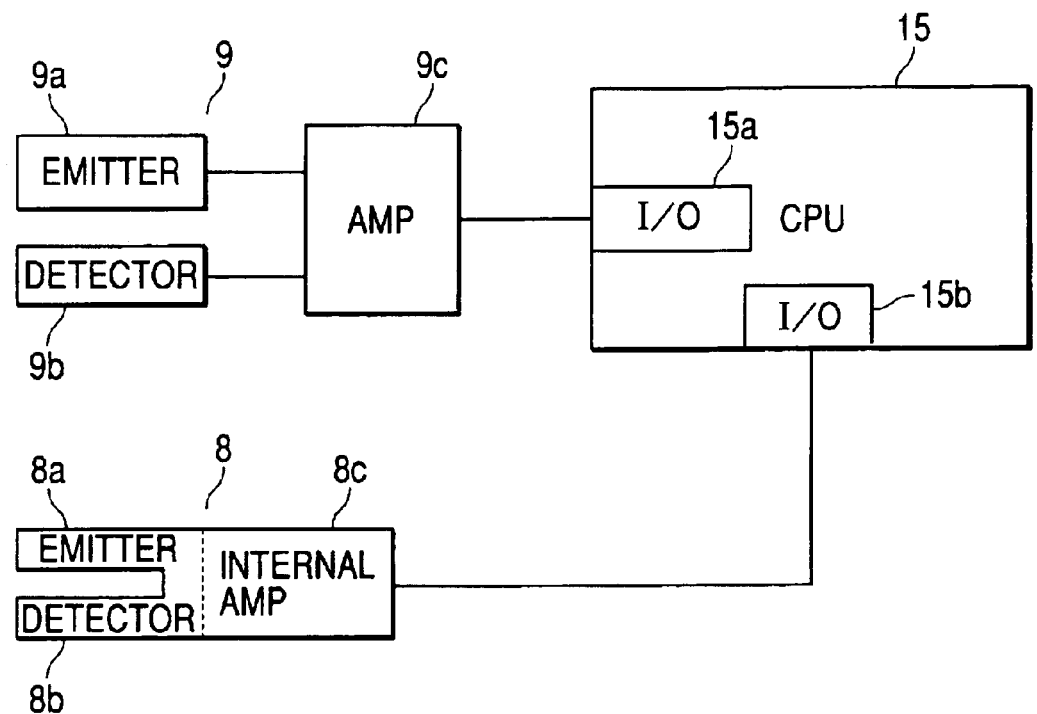
FIG. 8 is a diagram showing the circuit arrangement of a transmissive wafer detection sensor and a transmissive dog sensor according to the present invention.

Next in the following, the circuit arrangement of the transmissive wafer detection sensor 9 and the transmissive dog sensor 8 will be described with reference to FIG. 8. FIG. 8 is a diagram showing the circuit arrangement of the wafer processing apparatus 50 having a wafer mapping function according to the present embodiment.

The wafer processing apparatus 50 has a central processing unit 15 (which will be referred to as a CPU hereinafter) serving as a computing means. The emitter 9a and the detector 9b of the transmissive wafer detection sensor 9 are connected to an amplifier 9c, which amplifies a signal from the transmissive wafer detection sensor 9. The amplifier 9c is connected to the CPU 15 via an input-output port 15a (which will be referred to as I/O port 15a hereinafter). The amplified signal from the transmissive wafer detection sensor 9 is sent to the CPU15 through the I/O port 15a. The signal is temporarily stored and then processed in the CPU 15. On the other hand, the emitter 8a and the detector 8b of the transmissive dog sensor 8 are connected to a built-in amplifier 8c that is built in the transmissive dog sensor 8. The built-in amplifier 8c amplifies a signal from the transmissive dog sensor 8. The built-in amplifier 8c is connected to the CPU via an input/output port 15b (which will be referred to as I/O port 15b hereinafter). The amplified signal from the transmissive dog sensor 9 is sent to the CPU15 through the I/O port 15b. The signal is temporarily stored and then processed in the CPU 15.

In the following, the signal processing principle and the signal processing flow in the CPU 15 for the signal from the transmissive wafer detection sensor 9 and the signal from the transmissive dog sensor 8 will be described.

In this embodiment, the movable portion 56 for the transmissive dog sensor 8 and the transmissive wafer detection sensor 9 is moved by the air-operated rodless cylinder 55. The operation speed of the air-operated cylinder is not stable, and the variation in the speed with time is especially large in the early stage just after the operation of the cylinder is started and in the stage in which the operation of the cylinder is stopped. Therefore, the period or range in which the wafer detection by the transmissive wafer detection sensor 9 is performed and the period or range in which the detection by the transmissive dog sensor 8 is performed is set in such a way that the detections are performed in a period other than the early stage and the operation stopping stage in which the speed variation is large.

Figure 9:
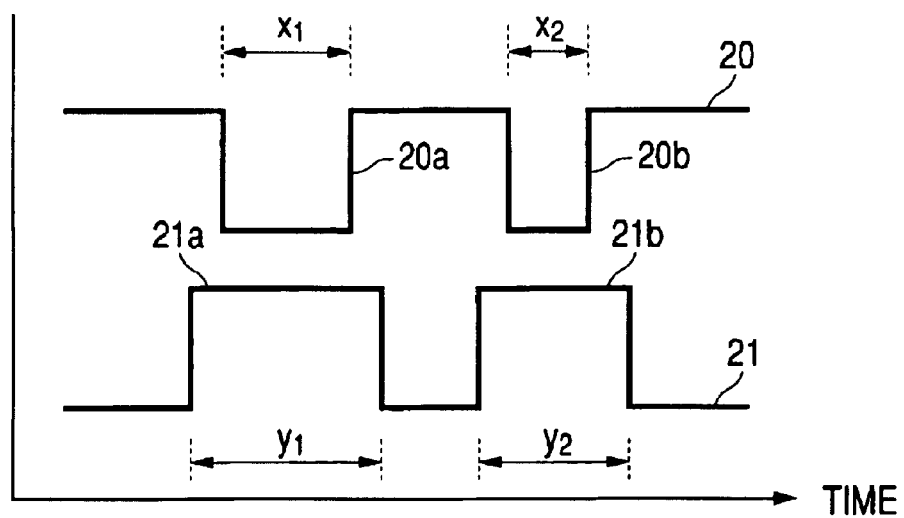
FIG. 9 is a diagram showing a relationship between a signal of the transmissive wafer detection sensor and a signal of the transmissive dog sensor.

FIG. 9 shows a signal 20 output from the transmissive wafer detection sensor 9 and a signal 21 output from the transmissive dog sensor 8. In FIG. 9, there is shown a signal section 21a of the signal 20 from the transmissive dog sensor 8 that is generated at the time corresponding to a signal section 20a of the signal 20 from the transmissive wafer detection sensor 9 and a signal section 21b of the signal 20 from the transmissive dog sensor 8 that is generated at the time corresponding to a signal section 20b of the signal 20 from the transmissive wafer detection sensor 9. In general, in the case that the speed of the movable portion 56 is constant with a high degree of accuracy, the time duration $x_1$ of the signal section 20a of the signal 20 from the transmissive wafer detection sensor 9 and time duration $x_2$ of the signal section 20b of the signal 20 from the transmissive wafer detection sensor 9 should be the same, and the time duration $y_1$ of the signal section 21a of the signal 21 from the transmissive dog sensor 9 and time duration $y_2$ of the signal section 21b of the signal 21 from the transmissive dog sensor 9 should be the same. However, in the case a variation in the speed occurs, the time duration $x_1$ of the signal section 20a and the time duration $x_2$ of the signal section 20b can be different and the time duration $y_1$ of the signal section 21a and the time duration $y_2$ of the signal section 21b can be different, as is the case in FIG. 9. However even in that case, since the transmissive wafer detection sensor 9 and the transmissive dog sensor 8 are moved by the same movable portion 56 at the same speed and the speed is substantially constant over the length corresponding to one shelf of the rack, the ratios of the signal duration time $x_1/y_1$ and $x_2/y_2$ are the same. In other words, letting x be the signal duration time of the signal 20 from the transmissive wafer detection sensor 9 and letting y be the signal duration time of the signal 21 from the transmissive dog sensor 8, their ratio x/y is constant.

Consequently, letting t(m) be the thickness of a wafer and letting d(m) be the width of index means 12 in the form of a notch of the dog, the following formula (1) always holds.

$$d(m):y(sec)=t(m):x(sec) \quad (1)$$

Therefore, the thickness t(m) of the wafer can be obtained from the following equation.

$$t=dx/y(m) \quad (2)$$

Thus, in the case that a value obtained as a result of measurement is substantially close to the thickness of a single wafer, it can be determined that there is one wafer, while in the case that the obtained value is substantially close to the thickness of the two wafers, it can be determined that there are two wafers. However, in practice, there is a little variation and the obtained value does not always correspond to the thickness of the wafer 1. Therefore, that value is calculated for the case of one wafer and the case of using thickness of two wafers, so that a value is set as a reference value $t_R$ for the thickness of the wafer 1. Then, a predetermined margin C is added to the reference value $t_R$, so that a threshold value $t_S$ is determined in the following way. The predetermined margin C may be set, for example, to $3.5 \times 10^{-4}$(m), which is nearly equal to half the thickness of the wafer 1.

$$t_S = t_R + C \quad (3)$$

Thus, in the case that the measured thickness t of the wafer is larger than the threshold value $t_S$, it is determined that there is two wafers, while in the case that the measured thickness t of the wafer is equal to or smaller than the threshold value $t_S$, it is determined that there is one wafer.

In the actual measurement, there is a variation in the value of the ratio (x/y) of the signal duration time x(sec) of the signal 20 from the transmissive wafer detection sensor 9 and the signal duration time y(sec) of the signal 21 from the transmissive dog sensor 8. Therefore, it is desirable that the reference value $t_R$ be determined by calculating a simple average of a plurality of measurement data or using the median value of the variation range of the measurement data. In these cases, it may be conceived to implement process 1 of performing teaching during a test run of the apparatus before the actual measurement to obtain the reference value $t_R$ and then to determined the threshold value $t_S$, or to implement process 2 of obtaining the reference value $t_R$ based on values obtained in the actual measurement and to thereby obtain the threshold value $t_S$. Furthermore, the calculation process for determining the threshold value $t_S$ from the reference value $t_R$ may be performed in the CPU 15 provided in the wafer processing apparatus 50 or may be determined by the CPU 15 using values that have been calculated and stored in memory means in advance.

Needless to say, as will be understood from FIG. 9, absence of wafer corresponding signal part of the signal 20 from the transmissive wafer detection sensor 9 means absence of a wafer on a shelf of the rack.

In the following, the signal processing process carried out in the CPU 15 for the signal from the transmissive wafer detection sensor 9 and the signal from the transmissive dog sensor 8 will be described with reference to FIGS. 10 and 11.

Typically, a teaching process (shown in FIG. 10) is performed prior to a mapping process as a process for detecting the actual wafer thickness. In the teaching process, the pod is subjected to the process under the state that at least one wafer is placed on a shelf of the rack in the pod. It is not necessary to place wafers on all of the shelves of the rack. The object of the teaching can be attained so long as at least one wafer is placed on a shelf.

Figure 10:
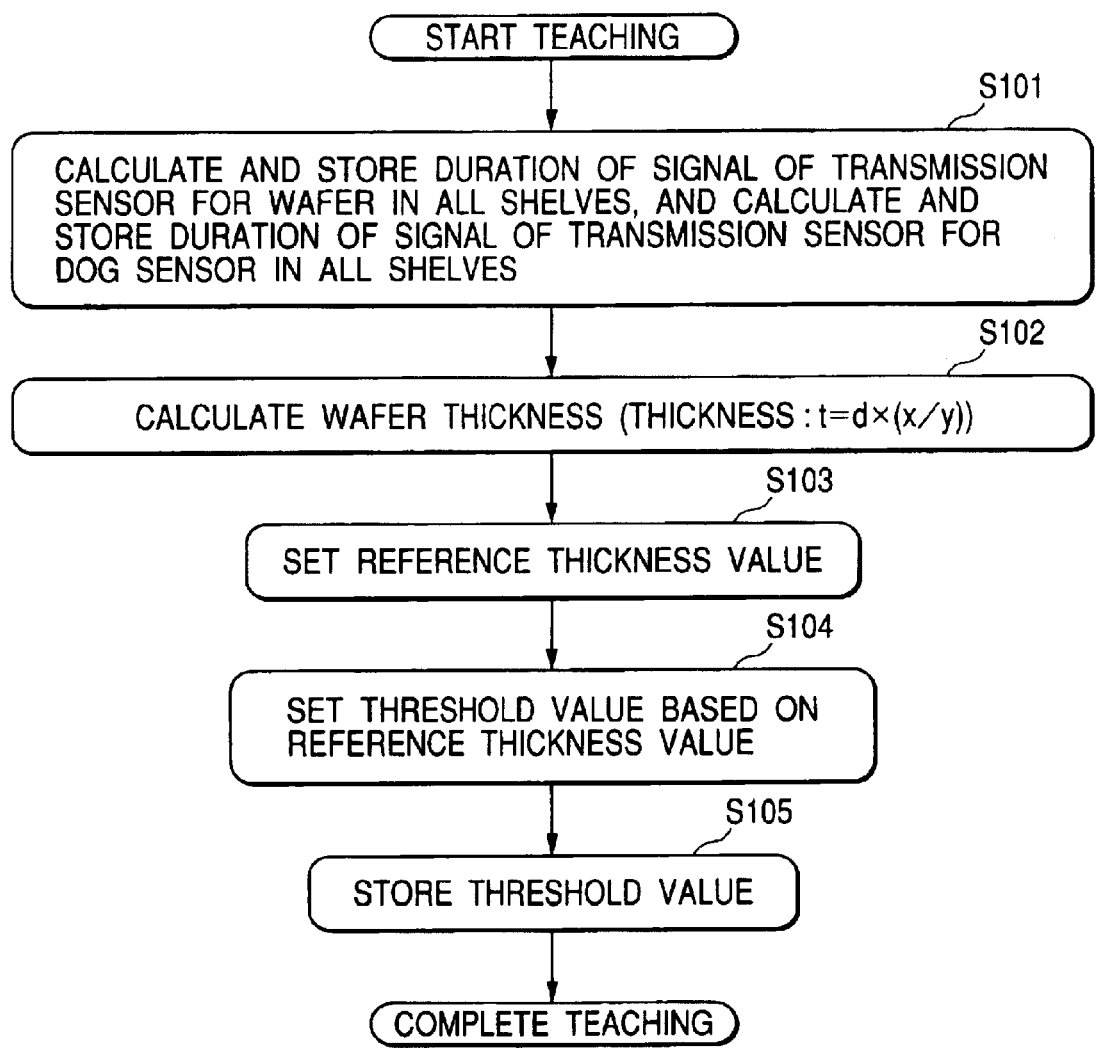
FIG. 10 is a flow chart of a signal processing in a teaching process in a first embodiment of the present invention.
Figure 11:
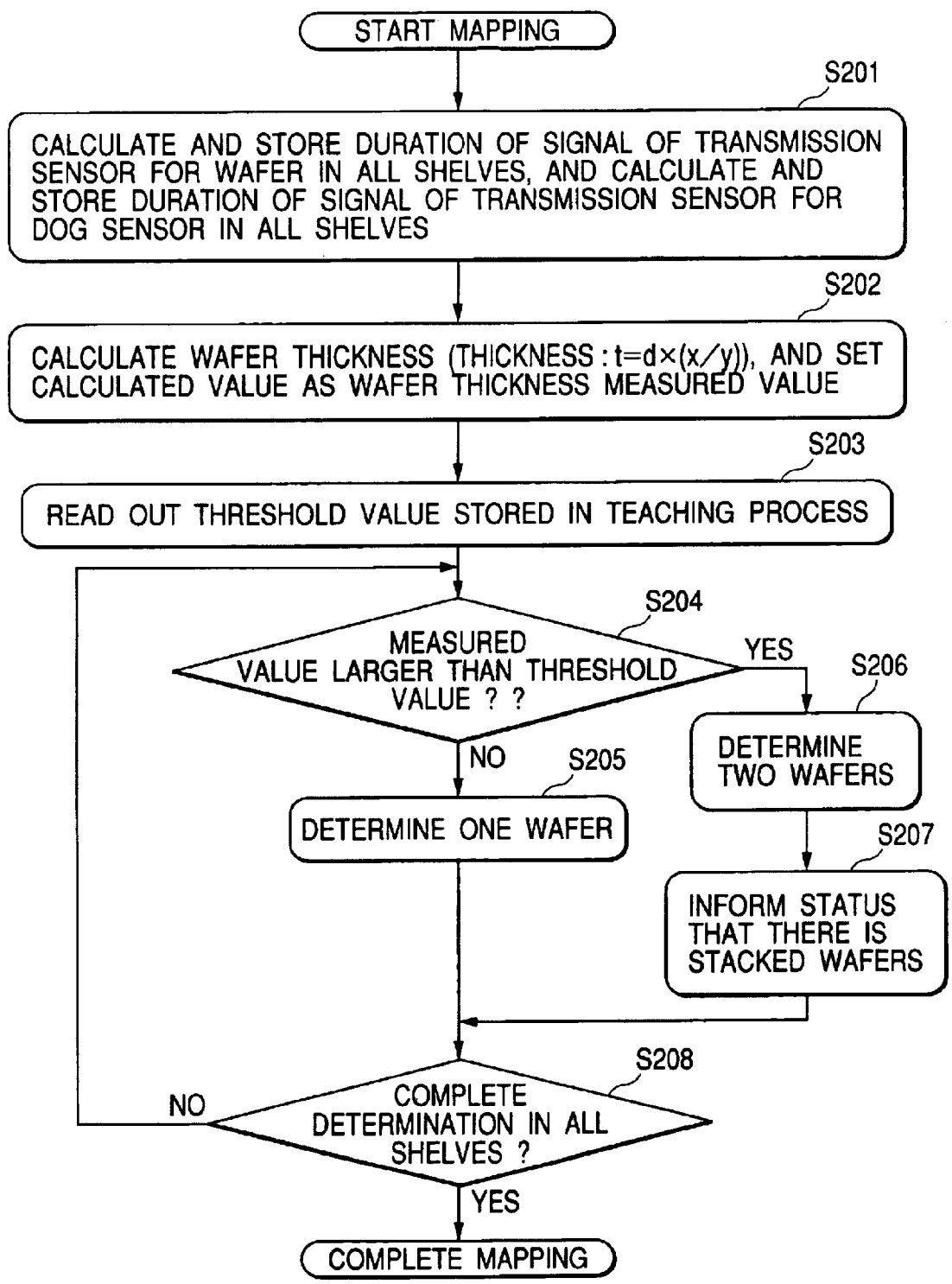
FIG. 11 is a flow chart of a signal processing in a mapping process in a first embodiment of the present invention.

FIG. 10 is a flow chart of the teaching process in the present embodiment. First in the teaching process, while the movable portion 56 is moved, the signal duration time x of the signal from the transmissive wafer detection sensor 9 is obtained and calculated for all of the shelves and the signal duration time y of the signal from the transmissive dog sensor 8 is obtained and calculated, so that the resultant duration times are stored in predetermined memory means (step S101). Next, the wafer thickness is obtained for the wafer(s) on all of the shelves by calculating the value $d\times(x/y)$ based on the width d of the index means of the dog, the signal duration time x of the signal from the transmissive wafer detection sensor 9 and the signal duration time y of the signal from the transmissive dog sensor 8 (step S102). The simple average of the thickness of the plurality of wafers is calculated and the obtained value is set as the reference thickness value $t_R$ (step S103). The threshold value $t_S$ is determined by adding a predetermined margin C to the reference thickness value $t_R$ (step S104). The threshold value $t_S$ is stored in memory means (step S105). Thus the teaching process is completed. It is preferable that the value C be set to 0.35 according to the above-described principle.

After the teaching process is completed, a mapping process for measuring and determining the actual wafer thickness is performed. FIG. 11 is a flow chart of the mapping process in the present embodiment. In that process, while the movable portion 56 is moved, the signal duration time x of the signal from the transmissive wafer detection sensor 9 is obtained and calculated and the signal duration time y of the signal from the transmissive dog sensor 8 is obtained and calculated, so that the resultant duration times are stored in the predetermined memory means (step S201). Then, the wafer thickness is obtained by calculating the value $d\times(x/y)$ based on the width d of the index means of the dog, the signal duration time x of the signal from the transmissive wafer detection sensor 9 and the signal duration time y of the signal from the transmissive dog sensor 8, and the obtained value is set as a measurement value of the wafer thickness (step S202). The threshold value stored in the teaching process is read out (step S203). The reading-out of the threshold value may be performed prior to the process of obtaining the signal duration times x and y (step S201), or prior to the process of calculating the wafer thickness as a measurement value (step S202). Next, a comparison process of comparing the measurement value of the wafer thickness and the threshold value is performed (step S204). Thus, in the case that the measurement value of the wafer thickness is equal to or smaller than the threshold value, it is determined that there is one wafer on the shelf in question (step S205). In the case that measurement value of the wafer thickness is larger than the threshold value, it is determined that there are two wafers on the shelf in question (step S206). In the case that there is two wafers on the shelf, information that there are stacked wafers is displayed as an error message to indicate the fact that there are two wafers (step S207). When the measurement and the determination are completed for all of the shelves of the rack, the mapping process is completed (step S208).

(Second Embodiment)

The mapping process may be performed without carrying out the teaching process. In the first embodiment, the reference thickness used for the calculation of the threshold value is calculated by the teaching process. However, the second embodiment differs from the first embodiment in that the reference thickness is obtained in the stage of the actual measurement of the wafer thickness simultaneously. The process of this second embodiment can be implemented in the case that wafers are placed on at least two shelves of the rack and the number of the shelves of the rack on which multiple wafers are placed is not more than half the number of the shelves on which a wafer(s) is detected. In practice, the situation in which the number of the shelves on which a wafer(s) is placed is less than two is rare and the situation in which more than one wafers are placed on more than half of the shelves is unusual. Therefore, the scheme of this embodiment is also effective.

Figure 12:
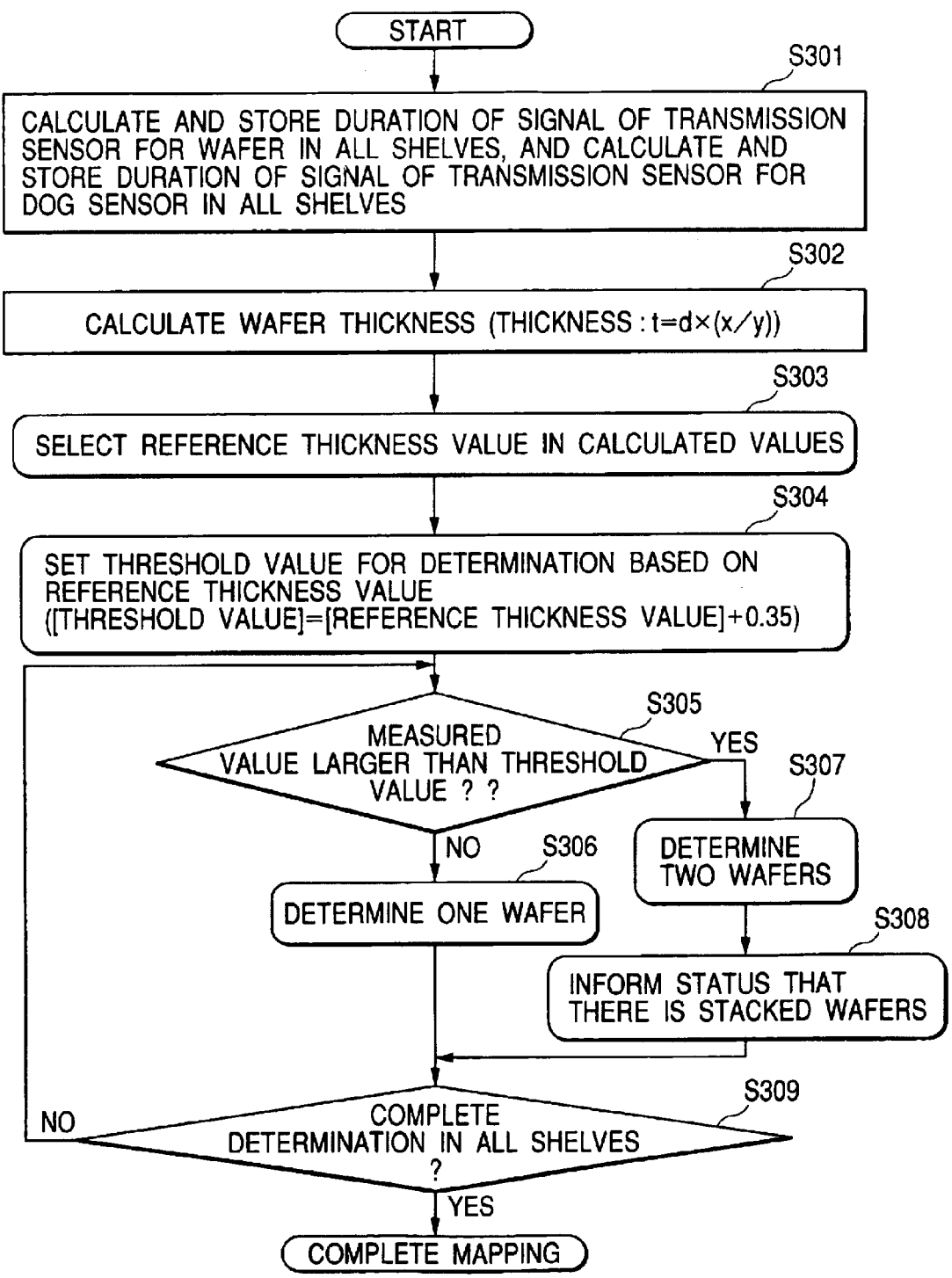
FIG. 12 is a flow chart of a signal processing in a second embodiment of the present invention.

FIG. 12 is a flow chart of a mapping process in the second embodiment. First in this process, while the movable portion 56 is moved, the signal duration time x of the signal from the transmissive wafer detection sensor 9 is obtained and calculated for all of the shelves and the signal duration time y of the signal from the transmissive dog sensor 8 is obtained and calculated, so that the resultant duration times are stored in predetermined memory means (step S301). Next, the wafer thickness is obtained for all of the wafers on the shelves by calculating the value $d\times(x/y)$ based on the width d of the index means of the dog, the signal duration time x of the signal from the transmissive wafer detection sensor 9 and the signal duration time y of the signal from the transmissive dog sensor 8 (step S302). The median value of the distribution of the obtained wafer thickness is determined as a reference thickness. Upon determining the median value, in the case that the number of the data of the wafer thickness is an even number, the median value cannot be determined uniquely. Therefore, the smaller one of the median values of the wafer thickness data is determined as the reference thickness (step S303). The threshold value $t_S$ is determined by adding a predetermined margin C to the reference thickness value $t_R$, and the threshold value $t_S$ is stored in memory means (step S304). It is preferable that the value C be set to 0.35 according to the above-described principle. Next, a comparison process of comparing the measurement value of the wafer thickness and the threshold value is performed (step S305). Thus, in the case that the measurement value of the wafer thickness is equal to or smaller than the threshold value, it is determined that there is one wafer on the shelf in question (step S306). In the case that measurement value of the wafer thickness is larger than the threshold value, it is determined that there are two wafers on the shelf in question (step S307). In the case that there is two wafers on the shelf, information that there are stacked wafers is displayed as an error message to indicate the fact that there are two wafers (step S308). When the measurement and the determination are completed for all of the shelves of the rack, the mapping process is completed (step S309).

While in the first and second embodiments, the detection is directed to the thickness up to two stacked wafers, it is possible to detect the thickness of more than two wafers only by changing the number of wafers placed in the teaching process.

According to the present invention, it is possible to effectively detect not only presence/absence of a wafer on a shelf in the pod but also the number of the wafers on a shelf with a simple structure; even if driving means with a large speed variation is used.

What is claimed is:

1. A wafer processing apparatus adapted to detect a wafer on each shelf of a rack having shelves on which wafers can be placed provided in a pod, the wafer processing apparatus comprising:

moving means that can be moved along said shelves of the rack by driving means;

a first transmissive sensor movable along the shelves of said rack by said moving means and including a first emitter and a first detector that are disposed in such a way as to be opposed to each other, said first emitter and said first detector being arranged in such a way that when said first transmissive sensor is moved along the shelves of the rack, in the case that a wafer is present on a shelf of the rack, light emitted from said first emitter toward said first detector is blocked by the wafer, and in the case that a wafer is not present on a shelf, light emitted from said first emitter is allowed to pass to said first detector;

a second transmissive sensor including a second emitter and a second detector opposed to said second emitter, said second transmissive sensor being movable along the shelves of said rack with said moving means;

a dog disposed between said second emitter and said second detector and having index means that can pass or block light emitted from said second emitter toward said second detector when said second transmissive sensor is moved along the shelves of said rack; and a computing means for performing determination of the number of the wafer(s) placed on a shelf of said rack by comparing a wafer thickness obtained by calculating a ratio of duration time of a first signal from said first transmissive sensor corresponding to the wafer(s) and duration time of a second signal from said second sensor corresponding to said index means and a threshold value that has been set in advance in accordance with the wafer thickness and the number of wafers.

2. A wafer processing apparatus according to claim 1, wherein said threshold value set in advance is set by calculating a reference thickness of one wafer based on ratio of duration time of said first signal obtained in relation to the number of the wafers placed on said rack and the speed of said moving means and duration time of said second signal, and adding a predetermined margin value to said reference thickness of one wafer.

3. A wafer processing apparatus according to claim 2, wherein data on the duration time of said first signal obtained in relation to the number of the wafers placed on said rack and the speed of said moving means and data on the duration time of said second signal respectively include a plurality of data, and said reference thickness of one wafer is calculated based on a plurality of ratio data obtained by calculating the ratio of the duration time of said first signal and the duration time of said second signal for the plurality of data on the duration time of said first signal and the duration time of said second signal.

4. A wafer processing apparatus according to claim 2, wherein said reference thickness of one wafer is calculated based on the ratio of the duration time of said first signal and the duration time of said second signal that are obtained under the state in which one wafer is placed on a shelf of said rack in advance.

5. A wafer processing apparatus according to claim 2 wherein said margin value is about half of the wafer thickness.

6. A wafer processing apparatus according to claim 1, wherein upon determination of the number of wafers, in the case that a signal is not generated from said first transmissive sensor, it is determined that a wafer is not present on a shelf of the rack;

in the case that the wafer thickness obtained from the ratio of the duration time of the first signal from said first transmissive sensor corresponding to the wafer(s) and the duration time of the second signal from said second sensor corresponding to said index means is equal to or smaller than said threshold value, it is determined that there is one wafer; and in the case that the wafer thickness obtained from the ratio of the duration time of the first signal from said first transmissive sensor corresponding to the wafer(s) and the duration time of the second signal from said second sensor corresponding to said index means is larger than said threshold value, it is determined that there are more than one wafers.

7. A wafer processing apparatus according to claim 2, wherein the calculation of said ratio for determining said reference value set in advance is executed by said computing means.

8. A wafer processing apparatus according to claim 1, wherein the second signal from said second transmissive sensor corresponding to said index means is a signal that is generated when light from said second emitter that has been blocked by said index means is delivered through the position of the index means to said second detector.

9. A wafer processing apparatus according to claim 1, wherein the second signal from said second transmissive sensor corresponding to said index means is a signal that is generated when light from said second emitter is blocked by said index means and does not reach said second detector.

10. A wafer processing apparatus according to claim 1, wherein said first emitter and said first detector are disposed in such a way that the path of the light emitted from said first emitter toward said first detector is inclined relative to the horizontal plane.

11. A wafer detection method for detecting, when a pod having a rack having shelves on which wafers can be placed provided therein is placed on a wafer processing apparatus, a wafer on each shelf, said wafer processing apparatus including:

moving means that can be moved along said shelves of the rack by driving means;

a first transmissive sensor movable along the shelves of said rack by said moving means and including a first emitter and a first detector that are disposed in such a way as to be opposed to each other, said first emitter and said first detector being arranged in such a way that when said first transmissive sensor is moved along the shelves of the rack, in the case that a wafer is present on a shelf of the rack, light emitted from said first emitter toward said first detector is blocked by the wafer, and in the case that a wafer is not present on a shelf, light emitted from said first emitter is allowed to pass to said first detector;

a second transmissive sensor including a second emitter and a second detector opposed to said second emitter, said second transmissive sensor being movable along the shelves of said rack with said moving means;

a dog disposed between said second emitter and said second detector and having index means that can pass or block light emitted from said second emitter toward said second detector when said second transmissive sensor is moved along the shelves of said rack;

said wafer detection method comprising:

an obtaining step of obtaining duration time of a first signal from said first transmissive sensor corresponding to a wafer(s) and duration time of a second signal from said second transmissive sensor corresponding to said index means;

a ratio calculation step of calculating a ratio of the duration time of said first signal and the duration time of said second signal that have been obtained;

a step of calculating the thickness of the wafer(s) based on said ratio; and a determination step of determining the number of the wafer(s) placed on a shelf of said rack by comparing the calculated thickness of the wafer(s) and a threshold value set in advance in accordance with the number of the wafers.

12. A wafer detection method according to claim 11, wherein said determination step includes a step of determining said threshold value set in advance by calculating a reference thickness of one wafer based on ratio of duration time of said first signal obtained in relation to the number of the wafers placed on said rack and the speed of said moving means and duration time of said second signal, and adding a predetermined margin value to said reference thickness of one wafer.

13. A wafer detection method according to claim 12, wherein in said obtaining step, data on the duration time of said first signal obtained in relation to the number of the wafers placed on said rack and the speed of said moving means and data on the duration time of said second signal respectively include a plurality of data, and the obtaining step including a step of obtaining said reference thickness of one wafer based on a plurality of ratio data obtained by calculating the ratio of the duration time of said first signal and the duration time of said second signal for the plurality of data on the duration time of said first signal and the duration time of said second signal.

14. A wafer detection method according to claim 12, further comprising a step of calculating said reference thickness of one wafer based on the ratio of the duration time of said first signal and the duration time of said second signal that are obtained under the state in which one wafer is placed on a shelf of said rack in advance.

15. A wafer detection method according to claim 12 wherein said margin value is about half of the wafer thickness.

16. A wafer detection method according to claim 11, in said determination step,
- in the case that a signal is not generated from said first transmissive sensor, it is determined that a wafer is not present on a shelf of the rack;
- in the case that the wafer thickness obtained from the ratio of the duration time of the first signal from said first transmissive sensor corresponding to the wafer(s) and the duration time of the second signal from said second sensor corresponding to said index means is equal to or smaller than said threshold value, it is determined that there is one wafer; and
- in the case that the wafer thickness obtained from the ratio of the duration time of the first signal from said first transmissive sensor corresponding to the wafer(s) and the duration time of the second signal from said second sensor corresponding to said index means is larger than said threshold value, it is determined that there are more than one wafers.

17. A wafer detection method according to claim 11, wherein the second signal from said second transmissive sensor corresponding to said index means is a signal that is generated when light from said second emitter that has been blocked by said index means is delivered from the index means to said second detector.

18. A wafer detection method according to claim 11, wherein the second signal from said second transmissive sensor corresponding to said index means is a signal that is generated when light from said second emitter is blocked by said index means and does not reach said second detector.

19. A wafer detection method according to claim 11, wherein the second signal from the second transmissive sensor corresponding to a signal from said second emitter in accordance with said index means is a signal that is generated when light from said second emitter is blocked by said index means and does not reach said second detector.

20. A wafer detection method according to claim 11, wherein said first emitter and said first detector are disposed in such a way that the path of the light emitted from said first emitter toward said first detector is inclined relative to the horizontal plane.

* * * * *